(12) United States Patent
Tanaka

(10) Patent No.: US 6,269,434 B1
(45) Date of Patent: Jul. 31, 2001

(54) RECORDING AND REPRODUCING APPARATUS INCLUDING A NONVOLATILE MEMORY WHICH INCLUDES A FIRST AREA FOR FILE MANAGEMENT TABLES AND A SECOND AREA FOR DATA AND A CONTROL UNIT

(75) Inventor: Kiichi Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/434,484

(22) Filed: Nov. 5, 1999

(30) Foreign Application Priority Data

Nov. 17, 1998 (JP) .................................. 10-326351

(51) Int. Cl.⁷ ....................................... G06F 12/00
(52) U.S. Cl. .................. 711/170; 711/202; 711/103; 707/205; 714/14
(58) Field of Search .................... 711/103, 104, 711/165, 170, 171, 172, 221, 202; 707/100, 205; 360/48; 369/272, 275.3; 714/14, 22, 24

(56) References Cited

U.S. PATENT DOCUMENTS

| | | | |
|---|---|---|---|
| 5,515,333 | * | 5/1996 | Fujita et al. ........................ 365/229 |
| 5,541,359 | * | 7/1996 | Lee ........................................ 84/645 |
| 5,544,312 | * | 8/1996 | Hasbun ................................ 714/22 |
| 5,585,845 | * | 12/1996 | Kawamura et al. ................ 348/231 |
| 5,630,093 | * | 5/1997 | Holzhammer et al. ............. 711/115 |
| 5,832,493 | * | 11/1998 | Marshall et al. .................... 707/101 |
| 5,867,466 | * | 2/1999 | Igarashi eta l. ................. 369/53.24 |
| 5,890,188 | * | 3/1999 | Okamoto et al. ..................... 711/5 |
| 5,930,467 | * | 7/1999 | Morita ................................ 358/1.16 |
| 6,078,520 | * | 6/2000 | Tobita et al. ..................... 365/185.09 |
| 6,094,693 | * | 7/2000 | Haneda .................................. 710/36 |
| 6,141,489 | * | 10/2000 | Honda ..................................... 386/95 |
| 6,170,066 | * | 1/2001 | See ........................................ 714/22 |

FOREIGN PATENT DOCUMENTS

| | | |
|---|---|---|
| 196 33 648 | 2/1998 | (DE) . |
| 0867884 | 9/1998 | (EP) . |
| 0924708 | 6/1999 | (EP) . |

* cited by examiner

Primary Examiner—Do Hyun Yoo
Assistant Examiner—Hong Kim
(74) Attorney, Agent, or Firm—Wenderoth, Lind & Ponack, L.L.P.

(57) ABSTRACT

A recording and reproducing apparatus includes a nonvolatile memory which acts as a recording medium; and a control unit for executing recording and reproduction on the nonvolatile memory; wherein the nonvolatile memory includes a first area for recording management information of whole of the nonvolatile memory and a second area for recording data of respective files; wherein the first area has a first file management table produced at the time of start of recording of the files and including at least a first management area for managing information on addresses of start sectors of the files and a second management area for managing information on usable space areas of the files; wherein the second area has a second file management table produced at a leading portion of each of sectors of each of the files on a real-time basis during recording of the files and formed by link information on corresponding ones of the sectors; wherein when the control unit executes recording and reproduction on the nonvolatile memory, the control unit performs file management on the basis of information from the first and second file management tables; wherein at the time of start of use of the nonvolatile memory, the control unit secures a space area from a leading portion of the second area so as to use the second area as a data area sequentially from the leading portion of the second area.

11 Claims, 11 Drawing Sheets

| SECTOR No. | FRONT LINK | REAR LINK | FILE No. | SOUND | SOUND | ...... | SOUND | |
|---|---|---|---|---|---|---|---|---|
| 100 | FFFF | 101 | 01 | DATA | DATA | ...... | DATA | |
|  | DATA | DATA | DATA | DATA | DATA | ...... | DATA | |
| 101 | 100 | 102 | 01 | DATA | DATA | ...... | DATA | |
|  | DATA | DATA | DATA | DATA | DATA | ...... | DATA | F1 |
| 102 | 101 | 103 | 01 | DATA | DATA | ...... | DATA | |
|  | DATA | DATA | DATA | DATA | DATA | ...... | DATA | |
| 103 | 102 | FFFF | 01 | DATA | DATA | ...... | DATA | |
|  | DATA | DATA | DATA | DATA | DATA | ...... | DATA | |
| 104 | FFFF | 105 | 02 | DATA | DATA | ...... | DATA | |
|  | DATA | DATA | DATA | DATA | DATA | ...... | DATA | F2 |
| 105 | 104 | FFFF | 02 | DATA | DATA | ...... | DATA | |
|  | DATA | DATA | DATA | DATA | DATA | ...... | DATA | |
| 110 | FFFF | 111 | 03 | DATA | DATA | ...... | DATA | |
|  | DATA | DATA | DATA | DATA | DATA | ...... | DATA | |
| 111 | 110 | 112 | 03 | DATA | DATA | ...... | DATA | F3 |
|  | DATA | DATA | DATA | DATA | DATA | ...... | DATA | |
| 112 | 111 | FFFF | 03 | DATA | DATA | ...... | DATA | |
|  | DATA | DATA | DATA | DATA | DATA | ...... | DATA | |
| 113 | **** | **** | ** | *** | *** | ...... | *** | |
|  | **** | **** | ** | *** | *** | ...... | *** | |
| 114 | **** | **** | ** | *** | *** | ...... | *** | 73 |
|  | **** | **** | ** | *** | *** | ...... | *** | |
| 115 | **** | 106 | ** | *** | *** | ...... | *** | |
|  | **** | **** | ** | *** | *** | ...... | *** | |
| 106 | 115 | 107 | ** | *** | *** | ...... | *** | |
|  | **** | **** | ** | *** | *** | ...... | *** | |
| 107 | 106 | 108 | ** | *** | *** | ...... | *** | |
|  | **** | **** | ** | *** | *** | ...... | *** | 74 |
| 108 | 107 | 109 | ** | *** | *** | ...... | *** | |
|  | **** | **** | ** | *** | *** | ...... | *** | |
| 109 | 108 | FFFF | ** | *** | *** | ...... | *** | |
|  | **** | **** | ** | *** | *** | ...... | *** | |

RECORDING AND REPRODUCING APPARATUS INCLUDING A NONVOLATILE MEMORY WHICH INCLUDES A FIRST AREA FOR FILE MANAGEMENT TABLES AND A SECOND AREA FOR DATA AND A CONTROL UNIT

BACKGROUND OF THE INVENTION

1. Field of the Invention

The present invention relates to a recording and reproducing apparatus which includes a nonvolatile memory acting as a recording medium for recording digital data and a microcomputer for executing recording and reproduction of data on the nonvolatile memory.

2. Description of the Prior Art

Figure 7:
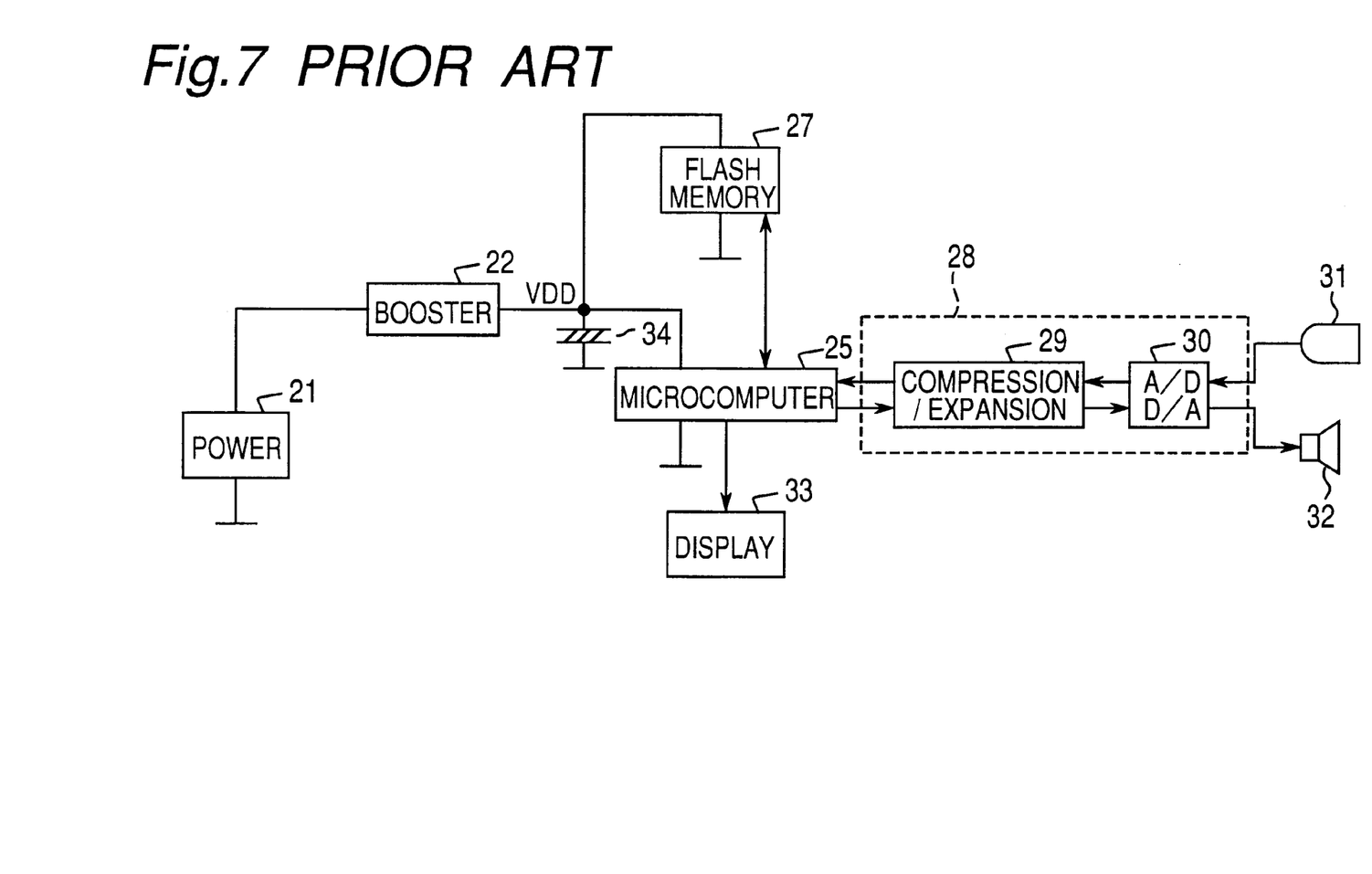
FIG. 7 is a block diagram of a prior art recording and reproducing apparatus (already referred to)
Figure 8:
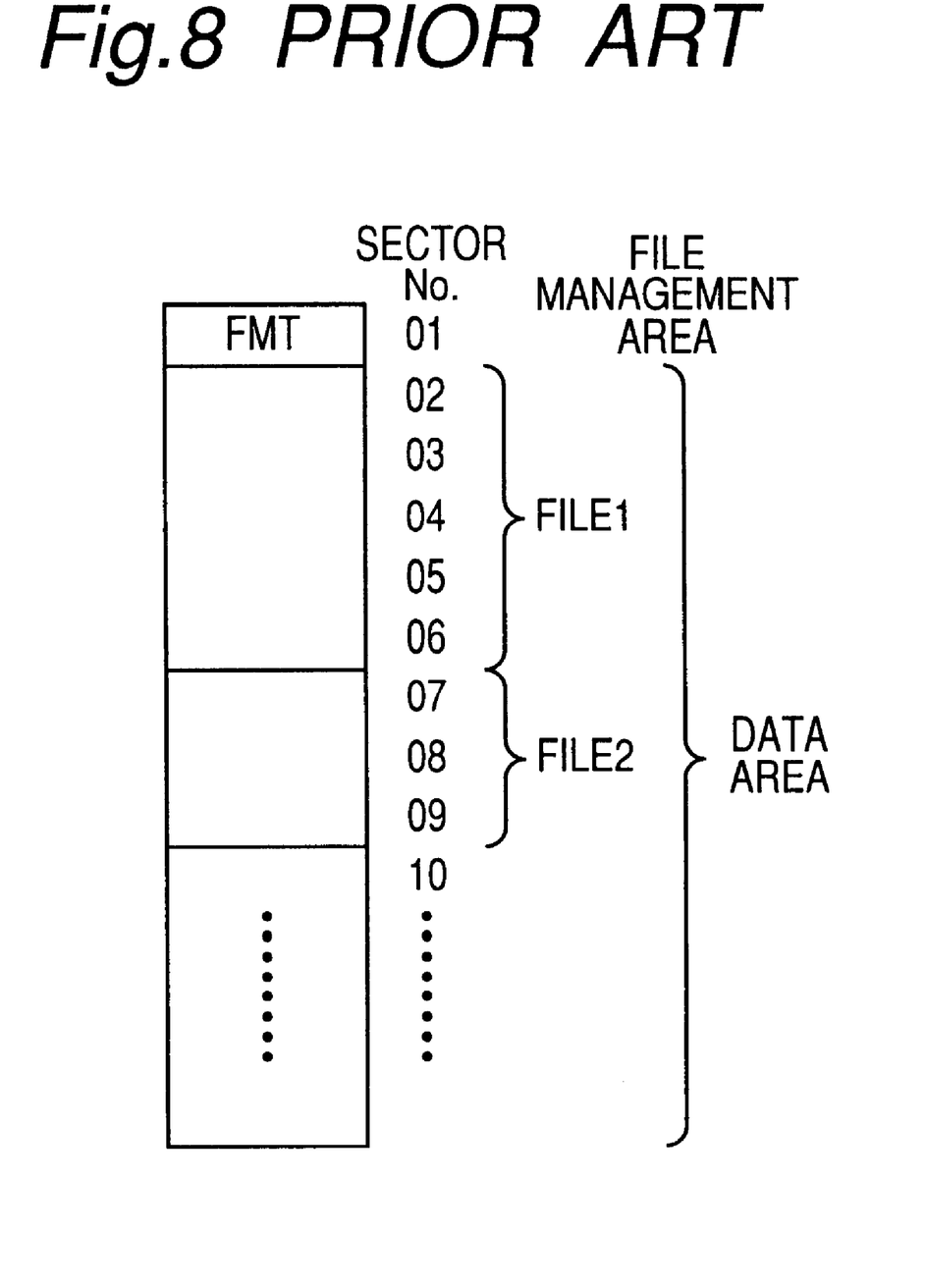
FIG. 8 is a view showing a data structure of a nonvolatile memory of the prior art recording and reproducing apparatus of FIG. 7 (already referred to).

FIG. 7 shows a conventional recording and reproducing apparatus and FIG. 8 shows a data structure of a nonvolatile memory of the conventional recording and reproducing apparatus of FIG. 7. In FIG. 7, the conventional recording and reproducing apparatus includes a power source 21 formed by a battery or the like, a booster 22, a decoupling capacitor 34, a flash memory 27 acting as the nonvolatile memory, a microcomputer 25, a display 33, a sound signal processor 28, a microphone 31 and a speaker 32. The sound signal processor 28 is constituted by a compression and expansion controller 29 and an A/D and D/A converting means 30. The power source 21 supplies a fixed voltage VDD to the whole conventional recording and reproducing apparatus through the booster 22. The decoupling capacitor 34 is provided at an output of the booster 22 so as to absorb variations of the fixed voltage VDD due to load variations.

Although not specifically shown, the conventional recording and reproducing apparatus includes various operating switches such as a recording key, a playback key, an erasure key and a stop key. For example, when the recording key has been operated, sound picked up by the microphone 31 is converted into digital data by the A/D and D/A converting means 30 and then, the digital data is compressed by compression function of the compression and expansion controller 29 so as to be recorded on the flash memory 27 via the microcomputer 25. On the other hand, when the playback key has been operated, compressed digital data recorded on the flash memory 27 is read out of the flash memory 27 and then, is delivered to the compression and expansion controller 29 by way of the microcomputer 25 so as to be expanded by expansion function of the compression and expansion controller 29. Subsequently, the expanded digital data is subjected to D/A conversion by the A/D and D/A converting means 30 so as to be converted into analog data such that the analog data is reproduced by the speaker 32.

Generally, in order to perform file management efficiently, a file management table (referred to as a "FMT", hereinafter) area (file management area) for collectively managing start addresses of files, etc. is provided in the flash memory 27 as shown in FIG. 8 so as to manage file information recorded in a data area of the flash memory 27.

In the conventional recording and reproducing apparatus in which the nonvolatile memory such as the flash memory 27 is employed as the recording medium and file management is performed by ordinary management of the FMT, the following disadvantages are incurred. Namely, if the battery is instantaneously detached from the conventional recording and reproducing apparatus due to vibrations during recording, data which is being recorded is invalidated. Meanwhile, if the battery is instantaneously detached from the conventional recording and reproducing apparatus during rewriting of the FMT area, the whole remaining file information may also be invalidated. Furthermore, if recording and reproduction are repeated in the conventional recording and reproducing apparatus, damage at the time of erasure and recording is concentrated at the FMT area and thus, service life of the nonvolatile memory is shortened extremely.

SUMMARY OF THE INVENTION

Accordingly, an essential object of the present invention is to provide, with a view to eliminating the above mentioned drawbacks of prior art recording and reproducing apparatuses, a recording and reproducing apparatus in which recorded data is not erased even at the time of instantaneous interruption or voltage reduction of a power source and service life of a nonvolatile memory can be lengthened by eliminating frequent access to a specific portion of the nonvolatile memory.

In order to accomplish this object of the present invention, a recording and reproducing apparatus according to the present invention comprises: a nonvolatile memory which acts as a recording medium; and a control means for executing recording and reproduction on the nonvolatile memory; wherein the nonvolatile memory includes a first area for recording management information of whole of the nonvolatile memory and a second area for recording data of respective files; wherein the first area has a first file management table produced at the time of start of recording of the files and including at least a first management area for managing information on addresses of start sectors of the files and a second management area for managing information on usable space areas of the files; wherein the second area has a second file management table produced at a leading portion of each of sectors of each of the files on a real-time basis during recording of the files and formed by link information on corresponding ones of the sectors; wherein when the control means executes recording and reproduction on the nonvolatile memory, the control means performs file management on the basis of information from the first and second file management tables; wherein at the time of start of use of the nonvolatile memory, the control means secures a space area from a leading portion of the second area so as to use the second area as a data area sequentially from the leading portion of the second area.

In accordance with the present invention, even at the time instantaneous interruption or voltage reduction of the power source happens, latest management information on the data recorded in the nonvolatile memory is properly written in the nonvolatile memory and the data recorded in the nonvolatile memory is not invalidated.

Moreover, in accordance with the present invention, since frequent access to the specific portion of the nonvolatile memory is eliminated, service life of the nonvolatile memory can be lengthened.

BRIEF DESCRIPTION OF THE DRAWINGS

This object and features of the present invention will become apparent from the following description taken in conjunction with the preferred embodiment thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Figure 1:
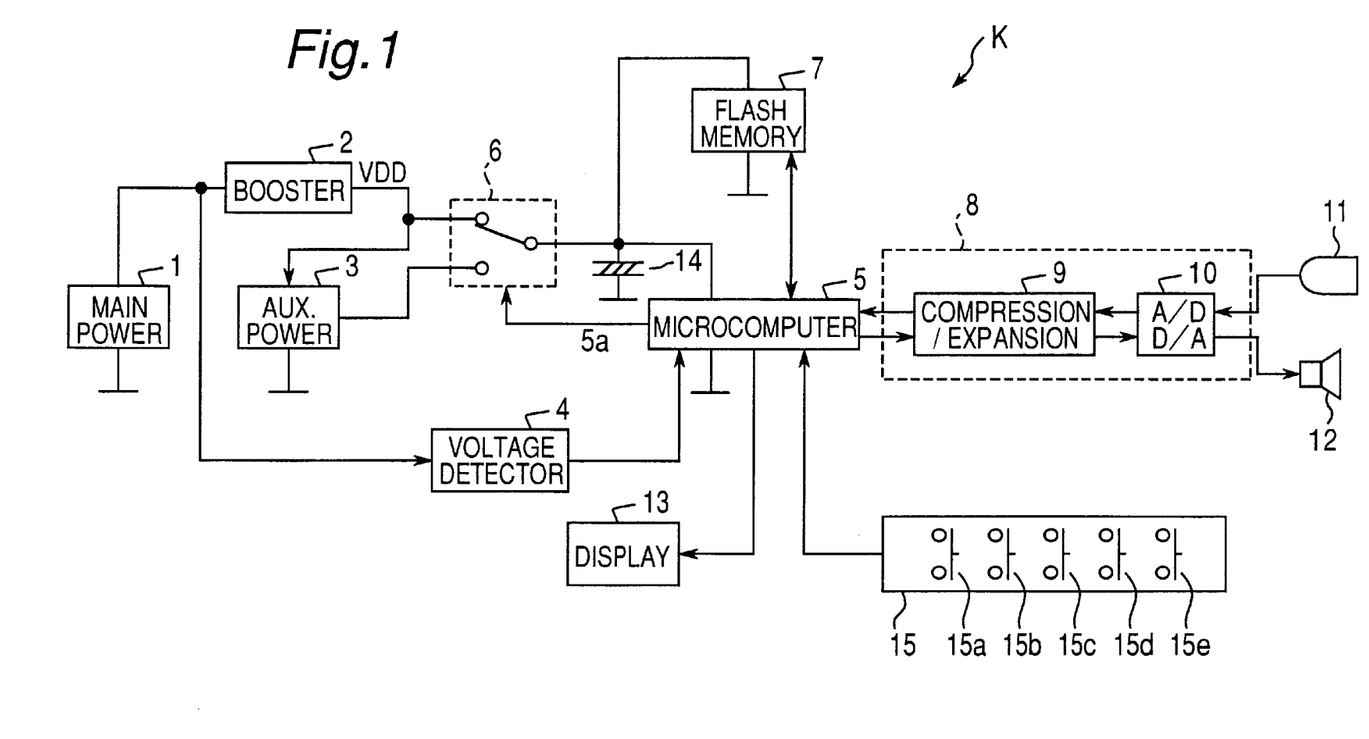
FIG. 1 is a block diagram of a recording and reproducing apparatus according to one embodiment of the present invention.

Hereinafter, one embodiment of the present invention is described with reference to FIGS. 1 to 5. FIG. 1 shows a recording and reproducing apparatus K according to the one embodiment of the present invention. In the same manner as a prior art recording and reproducing apparatus of FIGS. 7 and 8, the recording and reproducing apparatus K includes a main power source 1 formed by a battery or the like, a booster 2, a decoupling capacitor 14, a flash memory 7 acting as a nonvolatile memory, a microcomputer 5, a display 13, a sound signal processor 8, a microphone 11 and a speaker 12. The sound signal processor 8 is constituted by a compression and expansion controller 9 for compressing and expanding digital data so as to efficiently record digitized data on the flash memory 7 and an A/D and D/A converting means 10 for performing A/D and D/A conversions and is provided for recording and reproducing sound through A/D and D/A conversions.

The recording and reproducing apparatus K further includes an auxiliary power source 3, a voltage detector 4, a power source switching means 6 for switching over a power source of the recording and reproducing apparatus K to one of output of the booster 2 and output of the auxiliary power source 3 and an operating panel 15 having various operating switches such as a recording key 15a, a playback key 15b, a separate erasure key 15c, a collective erasure key 15d and a stop key 15e.

The main power source 1 supplies a fixed voltage VDD to the whole recording and reproducing apparatus K through the booster 2. The auxiliary power source 3 incorporates a secondary battery or the like and is recharged by output of the booster 2 so as to function as an auxiliary power source when the main power source 1 is incapable of supplying electric power to the recording and reproducing apparatus K. The auxiliary power source 3 is provided for supplying electric power to the microcomputer 5 and the flash memory 7. The voltage detector 4 is connected to the main power source 1 and monitors voltage of the main power source 1 so as to output its monitoring result to the microcomputer 5. The microcomputer 5 issues commands, for example, outputs a power source switching signal 5a to the power source switching means 6 when output of the voltage detector 4 has dropped upon detection of voltage reduction of the main power source 1.

The power source switching means 6 is controlled by the power source switching signal 5a from the microcomputer 5 and normally selects output of the booster 2. Writing, read-out and erasure on the flash memory 7 are controlled by the microcomputer 5. Input of sound to the sound signal processor 8 is performed by the microphone 11, while output of sound from the sound signal processor 8 is performed by the speaker 12. The display 13 is provided for displaying operational states of the recording and reproducing apparatus K, e.g., recording and reproducing states of the flash memory 7. The decoupling capacitor 14 is provided for output of the booster 2 so as to absorb variations of the fixed voltage VDD due to load variations.

Hereinafter, operation of the recording and reproducing apparatus K of the above described arrangement is described briefly. For example, when the recording key 15a has been operated, sound picked up by the microphone 11 is converted into digital data by the A/D and D/A converting means 10 and then, the digital data is compressed by compression function of the compression and expansion controller 9 so as to be recorded on the flash memory 7 via the microcomputer 5. Then, when the playback key 15b has been operated, the compressed digital data recorded on the flash memory 7 is read out of the flash memory 7 by the microcomputer 5 and then, is delivered to the compression and expansion controller 9 so as to be expanded by expansion function of the compression and expansion controller 9. Subsequently, the expanded digital sound data is subjected to D/A conversion by the A/D and D/A converting means 10 so as to be converted into analog data such that the analog data is reproduced by the speaker 12.

Then, operation of the recording and reproducing apparatus K at the time the battery or the like forming the main power source 1 has been instantaneously interrupted due to fall of the recording and reproducing apparatus K, etc. is described. When the main power source 1 has been instantaneously interrupted, electric power is not supplied to the booster 2 and thus, output of the booster 2 also vanishes. At the same time, the voltage detector 4 detects voltage reduction state of the main power source 1 and transmits this detection result to the microcomputer 5. Upon detection of the voltage reduction state of the main power source 1 by the voltage detector 4, the microcomputer 5 outputs the power source switching signal 5a to the power source switching means 6. In response to the power source switching signal 5a from the microcomputer 5, the power source switching means 6 changes over supply of the fixed voltage VDD of the recording and reproducing apparatus K to output of the auxiliary power source 3 from output of the booster 2 connected to the main power source 1. The auxiliary power source 3 is usually recharged by output of the booster 2 so as to be capable of outputting the fixed voltage VDD. Meanwhile, in addition to instantaneous interruption of the main power source 1 due to fall of the recording and reproducing apparatus K, etc., detection of voltage reduction of the main power source 1 is likewise performed also when output of the battery or the like forming the main power source 1 has dropped below a predetermined level due to its consumption.

As is clear from the foregoing description of this embodiment, even if voltage reduction happens due to instantaneous interruption of the main power source 1 or consumption of the battery or the like forming the main power source 1, the fixed voltage VDD of the recording and reproducing apparatus K can be secured. Meanwhile, in the recording and reproducing apparatus K, the voltage detector 4 is provided as a separate circuit element but may also be replaced by an A/D converting function imparted to the microcomputer 5.

Figure 2:
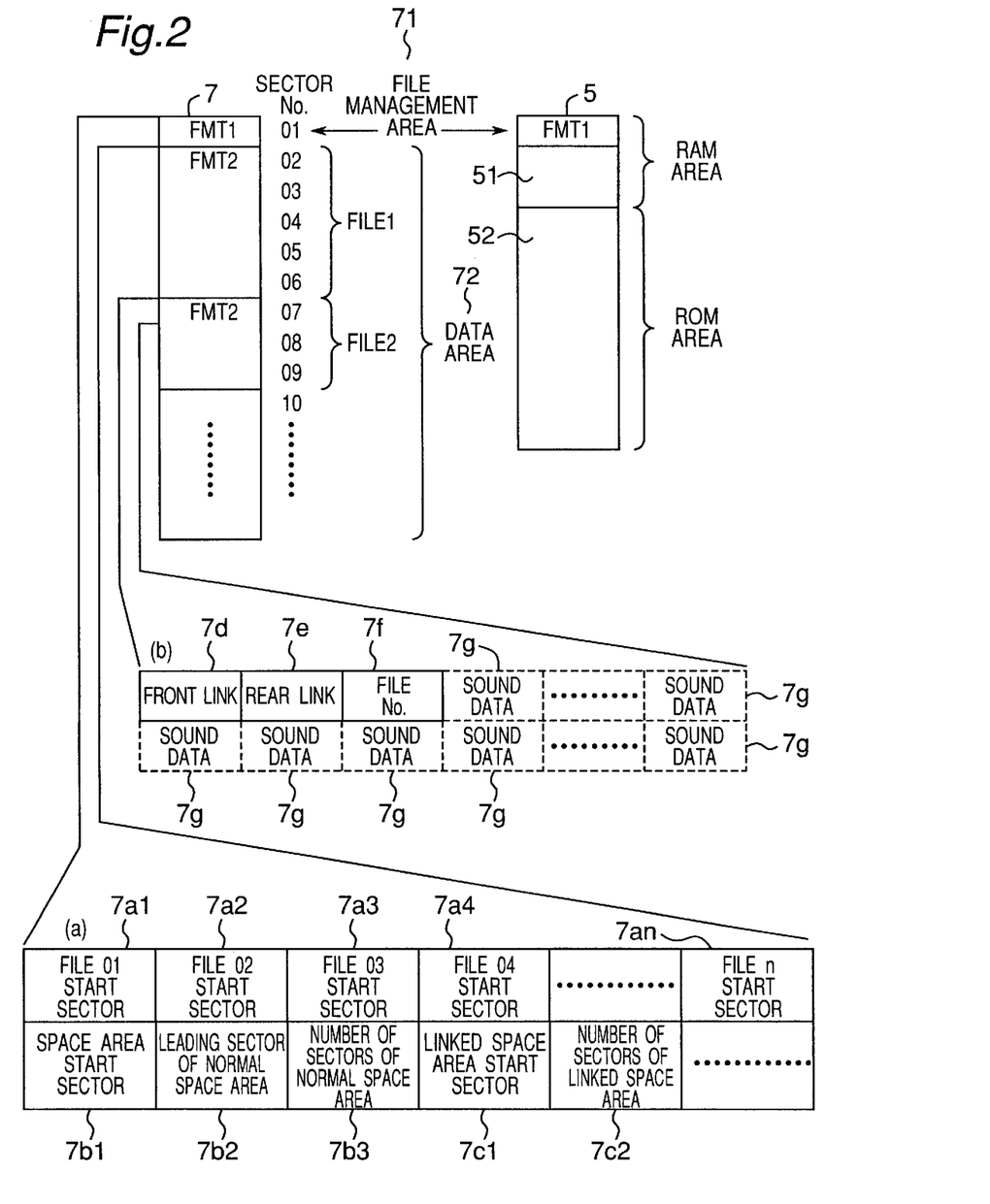
FIG. 2 is a view showing data structures of a nonvolatile memory and a microcomputer of the recording and reproducing apparatus of FIG. 1.

Hereinafter, file management in the flash memory 7 at the time digital data is recorded and reproduced on the flash memory 7 by the microcomputer 5 is described. An upper portion of FIG. 2 shows data structures of the microcomputer 5 and the flash memory 7 of the recording and reproducing apparatus K. The flash memory 7 is formed by an aggregate of sector Nos. 01 and so on each acting as a minimum recording unit. The flash memory 7 includes a file management area 71 acting as a first area and a data area 72 acting as a second area. The first area is formed by the sector No. 01, while the second area is formed by the sector Nos. 02 and so on. The second area is constituted by a plurality of files (record data) each having a plurality of the sectors in accordance with its data quantity.

The file management area 71 acting as the first area is formed as a file management table (referred to as a "FMT", hereinafter) and is provided at a leading one of usable sectors of the flash memory 7, i.e., the sector No. 01. The FMT is a table for writing therein management information of the whole flash memory 7, which is composed of information including at least information on start sector addresses and usable space areas of each of the files as shown at a lower portion (a) of FIG. 2. This table is designated by a first file management table (expressed by a "FMT1", hereinafter). Thus, the lower portion (a) of FIG. 2 shows an internal structure of the first file management table FMT1 of the sector No. 01 of the flash memory 7. The first file management table FMT1 is produced at the time of start of recording of the files. Meanwhile, in the data area 72 formed by the sector Nos. 02 and so on, a second file management table (expressed by a "FMT2", hereinafter) is produced at a leading portion of each sector of each of the files on a real-time basis during recording of the files. A middle portion (b) of FIG. 2 shows an internal structure of the second file management table FMT2 of the sector No. 07 of the flash memory 7. As shown at the middle portion (b) of FIG. 2, the second file management table FMT2 is a table for writing therein management information composed of link information on the sectors of each of the files. In case each of the files is constituted by a plurality of sectors, the second file management table FMT2 is provided at the leading portion of each of the sectors. Thus, for example, in the case of the file 1, a total of the five second file management tables FMT2 are, respectively, provided at leading portions of the sector Nos. 02 to 06. However, in FIG. 2, the single second file management table FMT2 is provided at each of the files for convenience of illustration. Therefore, the file management tables FMTs formed in the flash memory 7 are classified into the first and second file management tables FMT1 and FMT2.

As shown at the lower portion (a) of FIG. 2, the first file management table FMT1 includes information management areas 7a1 to 7an for recording information on start sector addresses of each of the files and an area for managing information on usable space areas of each of the files, which is constituted by an area 7b for managing information on normal space areas of each of the files and an area 7c for managing information on linked space areas of each of the files. The area 7b includes an area 7b1 for recording addresses of start sectors of space areas of each of the files at the time of start of recording, an area 7b2 for recording addresses of leading sectors of the latest normal space areas of each of the files and an area 7b3 for recording the number of sectors of the latest normal space areas of each of the files. Meanwhile, the area 7c is formed by information on sectors constituting separately erased files and includes an area 7c1 for recording addresses of start sectors of linked space areas linked to last sectors of normal space areas and an area 7c2 for recording the number of sectors of linked space areas, which sectors constitute files separately erased subsequently and linked to one another sequentially in the order of erasure.

Meanwhile, as shown at the middle portion (b) of FIG. 2, the second file management table FMT2 includes an area 7d for recording front link sector addresses to which the sectors of the corresponding files should be linked, an area 7e for recording rear link sector addresses to which the sectors of the corresponding files should be filed and an area 7f for recording file numbers of the corresponding files. Meanwhile, in the sector in which the second file management table FMT2 is provided, an area for recording the second file management table FMT2 is followed by data recording areas 7g.

Meanwhile, as shown at the upper portion of FIG. 2, the microcomputer 5 has a RAM area 51 and a ROM area 52. A file management table FMT1 which is expressed in the same manner as the first file management table FMT1 of the flash memory 7 for the sake of convenience is provided in the RAM area 51 and is a table for writing therein management information of the whole flash memory 7, which is composed of information including information on start addresses and usable space areas of each of the files of data recorded in the flash memory 7 in the same manner as the first file management table FMT1 formed in the file management area 71 acting as the first area of the flash memory 7. This management information FMT1 is adapted to be written in the RAM area 51 of the microcomputer 5 when data is recorded in the data area 72 of the flash memory 7.

Figure 3:
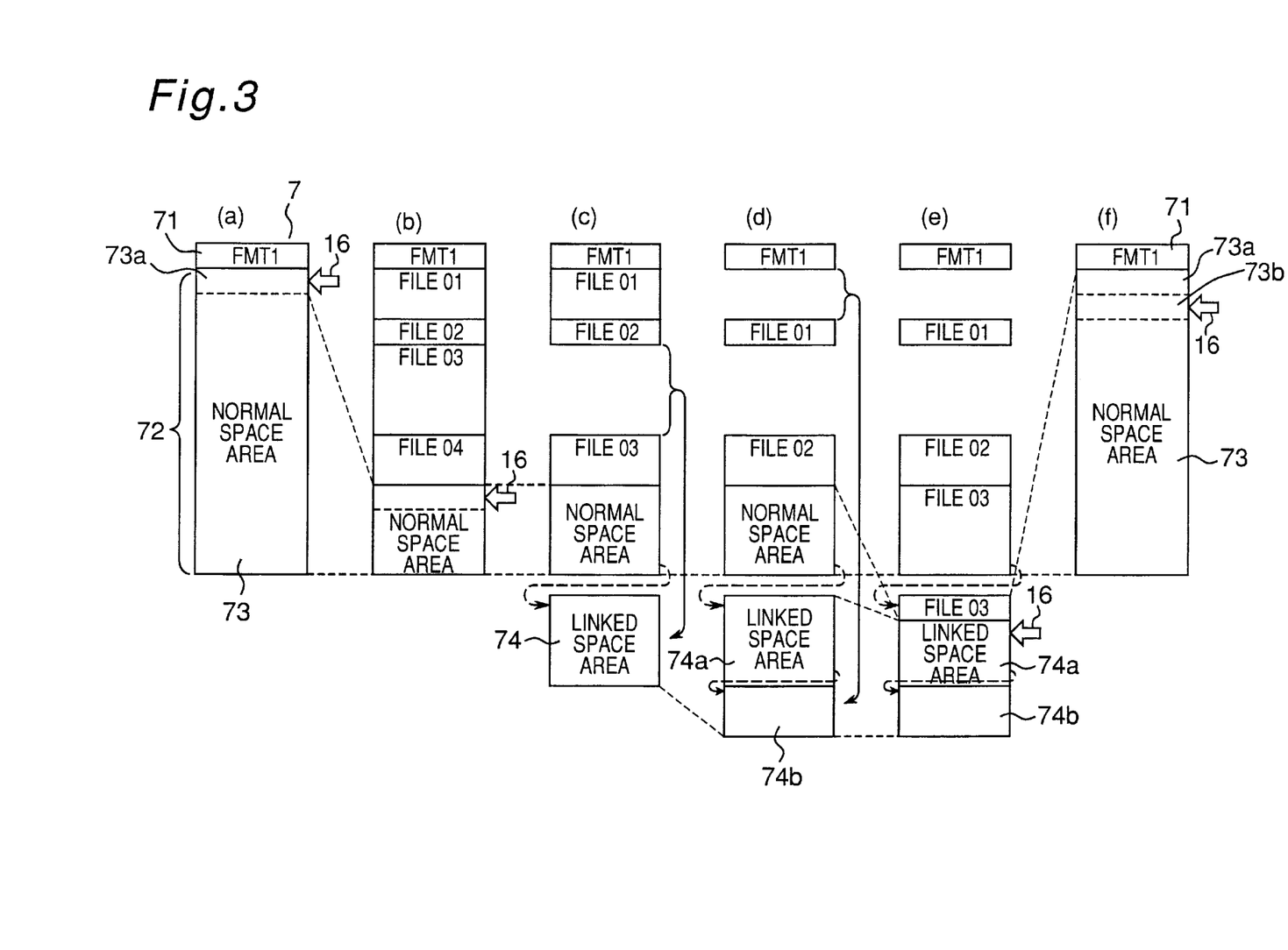
FIG. 3 is a view explanatory of working states of the nonvolatile memory of FIG. 2.

Hereinafter, working states of the flash memory 7 are described with reference to portions (a) to (f of FIG. 3 showing storage allocations of the flash memory 7 corresponding to recording and erasure of the flash memory 7. Initially, the portion (a) of FIG. 3 illustrates a working state of the flash memory 7 at the time of start of use of the flash memory 7. In this working state, the file management area 71 and a continuous normal space area 73 acting as the data area 72 are secured but a linked space area is not present. Meanwhile, at this time, use of the secured space area 73 is started from its leading sector 73a as indicated by a pointer 16. In the first file management table FMT1 of FIG. 2, an address of this leading sector 73a is recorded in the areas 7b1 and 7b2 and a total number of sectors of the secured space area 73 is recorded in the area 7b3.

Then, the portion (b) of FIG. 3 illustrates a working state of the flash memory 7 in which data of four files 1 to 4 has been recorded. From a leading portion of the space area 73, the space area 73 is sequentially allocated to the files 1 to 4. Start sectors of the files 1 to 4 are sequentially recorded in the areas 7a1 to 7a4 of the first file management table FMT1 of FIG. 2, respectively. The normal space area 73 is reduced by the files 1 to 4 and an address of a leading sector of the normal space area 73 indicated by the pointer 16 in the portion (b) of FIG. 3 is recorded in the area 7b2 of the first file management table FMT1 of FIG. 2. Furthermore, at the time of recording of the files 1 to 4 in the flash memory 7, link information on link between sectors of each of the files 1 to 4 is sequentially recorded in the areas 7d and 7e and file numbers of the files 1 to 4 are recorded in the area 7f in the second file management table FMT2 of FIG. 2.

Then, the portion (c) of FIG. 3 illustrates a working state of the flash memory 7 in which the third file 3 in the portion (b) of FIG. 3 has been erased. The file 3 in the portion (b) of FIG. 3 is allocated to a start area 74a of a linked space area 74 and an address of a leading sector of the file 3 in the portion (b) of FIG. 3 is recorded in the area 7c1 of the first file management table FMT1. File numbers of files following the erased file 3 in the portion (b) of FIG. 3 are reduced by one, respectively. The number of sectors of the separately erased file 3 in the portion (b) of FIG. 3, namely, the number of sectors of the linked space area 74a is recorded in the area 7c2 of the first file management table FMT1.

Then, the portion (d) of FIG. 3 illustrates a working state of the flash memory 7 in which the file 1 is further erased in the portion (c) of FIG. 3. In the portion (d) of FIG. 3, the file 1 is coupled, as a linked space area 74b, by a link to a rear of the linked space area 74a recorded in the portion (c) of FIG. 3. The number of sectors of the linked space area 74b is added to the number of sectors of the linked space area 74a so as to update the area 7c2 of the first file management table FMT1. Also in this case, file numbers of unerased files are reduced by one, respectively.

Then, the portion (e) of FIG. 3 illustrates a working state of the flash memory 7 in which recording has been performed subsequently. Use of a region is started as the new file 3 from the residual normal space area 73. At the time the normal space area 73 has been used completely, a region to be used is secured from a leading portion of the linked space area 74 so as to be used. At this time, an address of a leading sector of the residual linked space area 74a, which is indicated by the pointer 16 in the portion (e) of FIG. 3, is recorded in the area 7c1 of the first file management table FMT1 and the number of sectors used in the linked space area 74a is reduced in the area 7c2. In case the linked space area 74 has been used completely in this way, recording is terminated at the time. The linked space area 74 is illustrated so as to be disposed out of a frame indicative of the flash memory 7 for convenience but is, needless to say, disposed at a position of original sectors physically. Meanwhile, if linked space areas obtained by separately erasing the once recorded files and linking the separately erased files are used sequentially after the normal space area 73 has been used completely, frequencies of use of the respective sectors can be uniformized as much as possible.

Finally, the portion (f) of FIG. 3 illustrates a working state of the flash memory 7 in which the whole files have been erased after proper repetition of recording and reproduction. Here, the normal space area 73 is resecured in the data area 72 in the same manner as the portion (a) of FIG. 3. After the whole files have been erased, an address of a sector from which use of the space area 73 is started is so set as to be increased by one each time the whole files are erased. In this example, use of the space area 73 is started from the second sector 73b indicated by the pointer 16. The second sector 73b is managed as management information in the area 7b. Thus, an address of this sector 73b is recorded in the area 7a1 of the first file management table FMT1. This setting of the address of the sector for starting use of the normal space area 73, which is performed after the whole files have been collectively erased, requires storage of an address of a sector for starting use of the normal space area 73 at the time of the previous erasure of the whole files and the RAM area 51 of the microcomputer 5 is used as a storage means for the storage referred to above. Therefore, if the normal space area 73 is resecured and the address of the sector for starting use of the normal space area 73 is shifted each time the whole files are collectively erased, it becomes possible to uniformize frequencies of use of the whole flash memory 7. Meanwhile, each time the whole files are erased, the address of the sector for starting use of the normal space area 73 is increased by one as described above but may also be shifted rearwardly by two or more sectors from the sector employed at the time of start of use of the normal space area 73.

Hereinafter, operations of the recording and reproducing apparatus K at the time of recording, erasure, reproduction and detection of voltage reduction are described with reference to flowcharts of FIGS. 4A to 4D and 5 illustrating processing sequence of file management. Initially, at step S1, initialization is performed in which (1) the file management area 71 of the first file management table FMT1 disposed at the leading sector No. 01 of the flash memory 7 is initialized, (2) for the file management table FMT1 of the RAM area 51 of the microcomputer 5, start addresses of normal space areas and addresses of current space areas are set in sectors following the leading sector No. 01 of the flash memory 7, (3) linked space areas are set to be nonexistent and (4) an area corresponding to a necessary recording period, for example, a maximum recording period set in the recording and reproducing apparatus K provided with the flash memory 7 is secured.

Figure 4A:
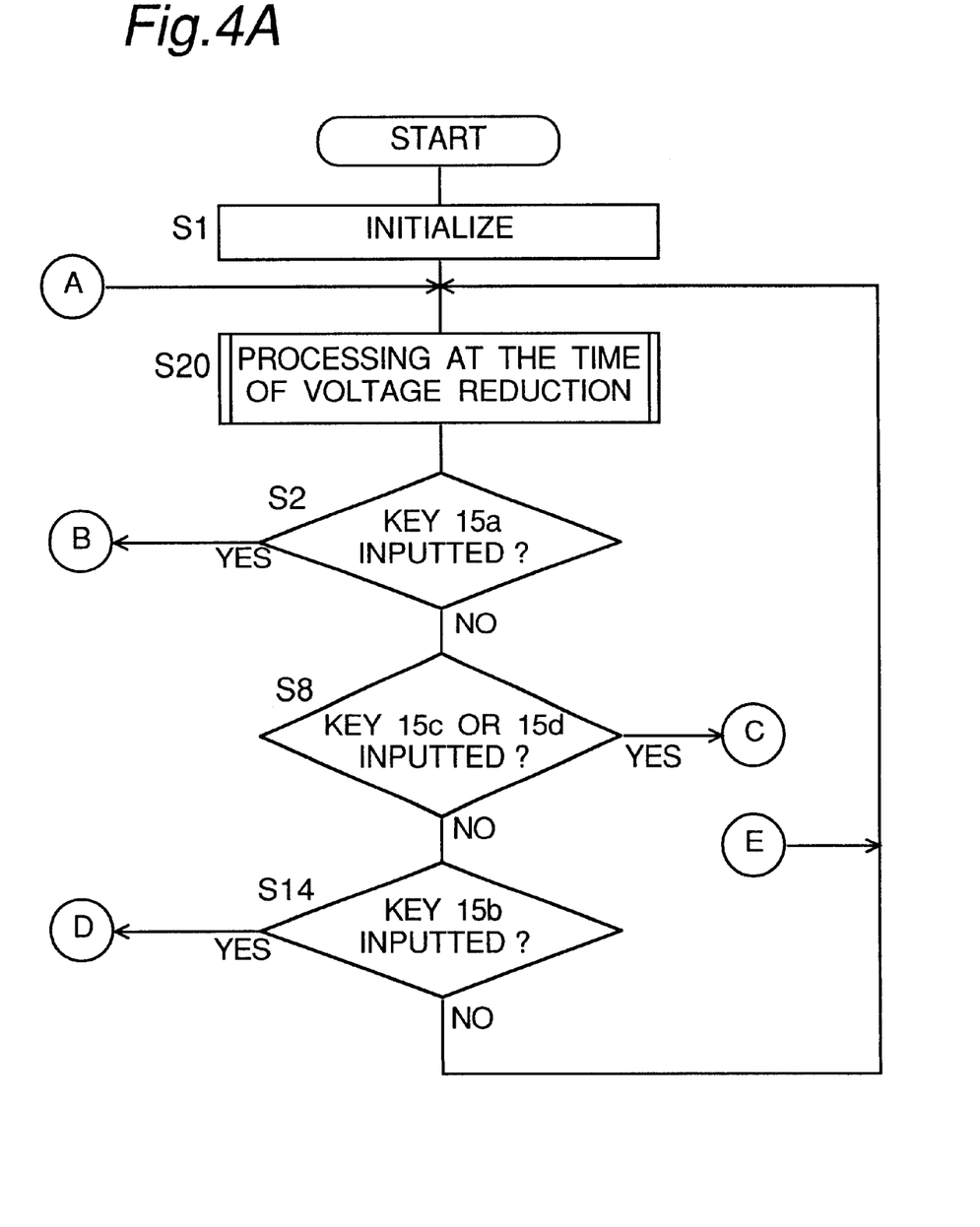
FIGS. 4A to 4D are flowcharts showing processing sequence of the microcomputer of FIG. 2.

Thereafter, a main processing for detecting key input and voltage reduction is constituted by steps S20, S2, S8 and S14 of FIG. 4A. Step S20 is a subroutine of FIG. 5 in which processings are performed when voltage reduction of the main power source 1 due to instantaneous interruption of the main power source 1 or consumption of the battery has been detected by monitoring output of the voltage detector 4 as described earlier. In the subroutine, it is initially judged at step S23 whether or not voltage reduction has occurred. In the case of "NO" at step S23, the program flow proceeds to step S2 of FIG. 4A. On the other hand, in the case of "YES" at step S23, current operation, for example, recording or reproduction is terminated at step S24. Then, at step S25, the power source switching signal 5a is outputted to the power source switching means 6 so as to change over supply of the fixed voltage VDD to output of the auxiliary power source 3 from output of the booster 2. Subsequently, at step S26, latest management information written in the file management table FMT1 of the RAM area 51 of the microcomputer 5 is written in the first file management table FMT1 of the file management area 71 of the flash memory 7 such that information in the file management table FMT1 of the microcomputer 5 is equalized with that of the first file management table FMT1 of the flash memory 7. Then, the program flow proceeds to step S2 of FIG. 4A.

Figure 4B:
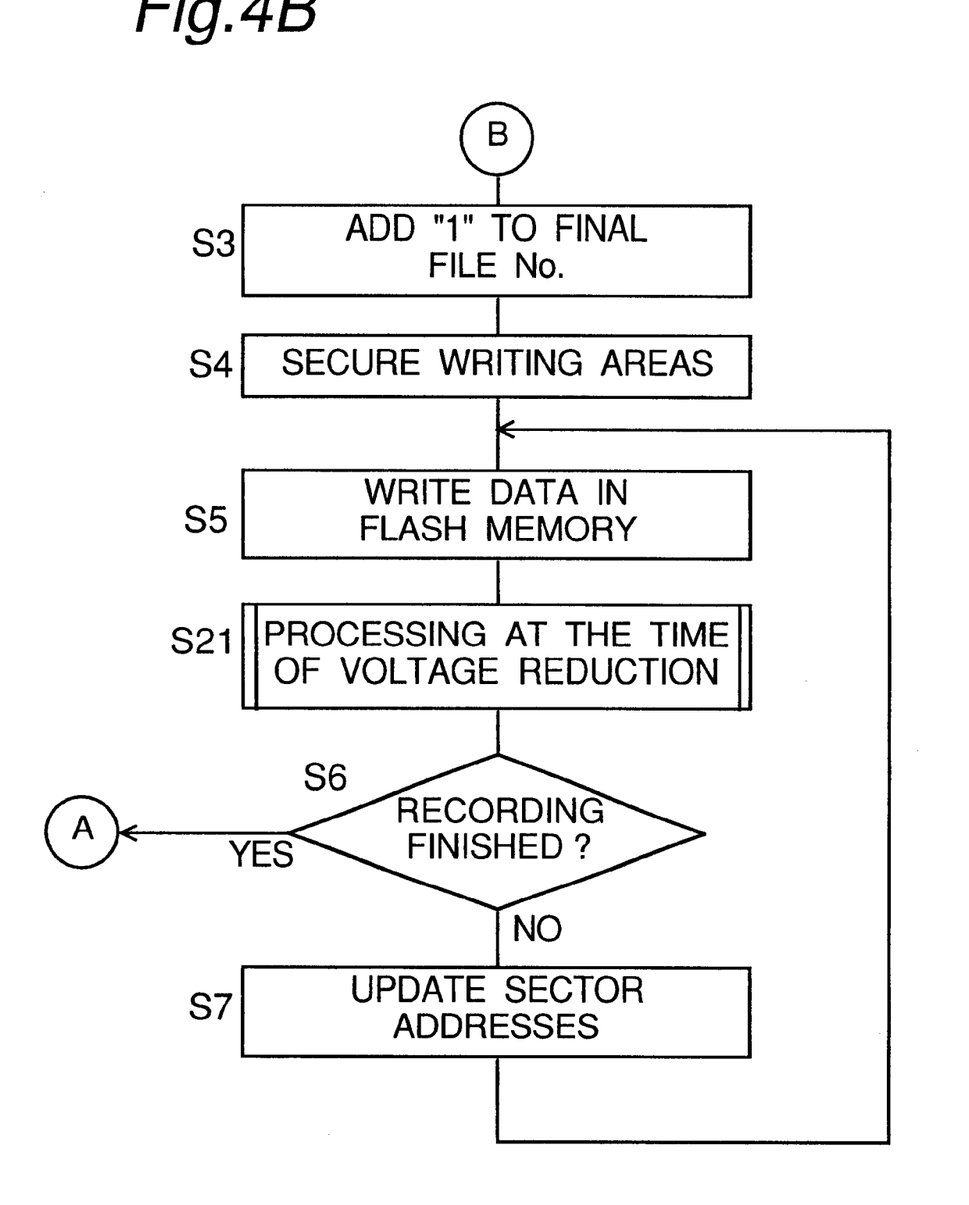
Figure 4C:
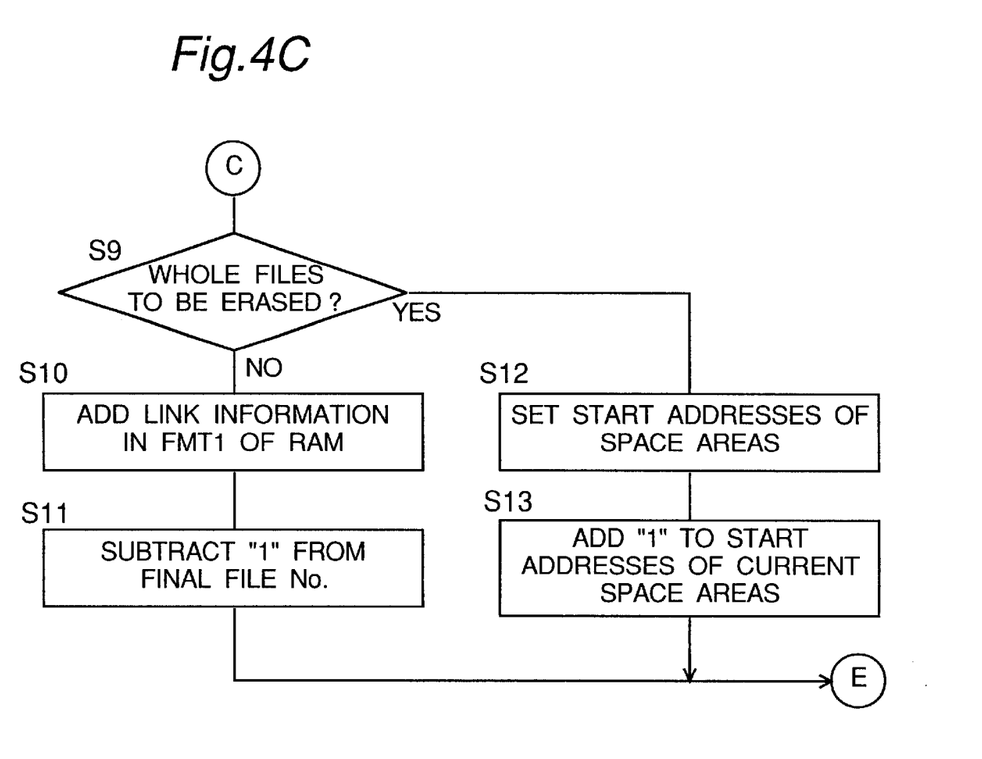
Figure 4D:
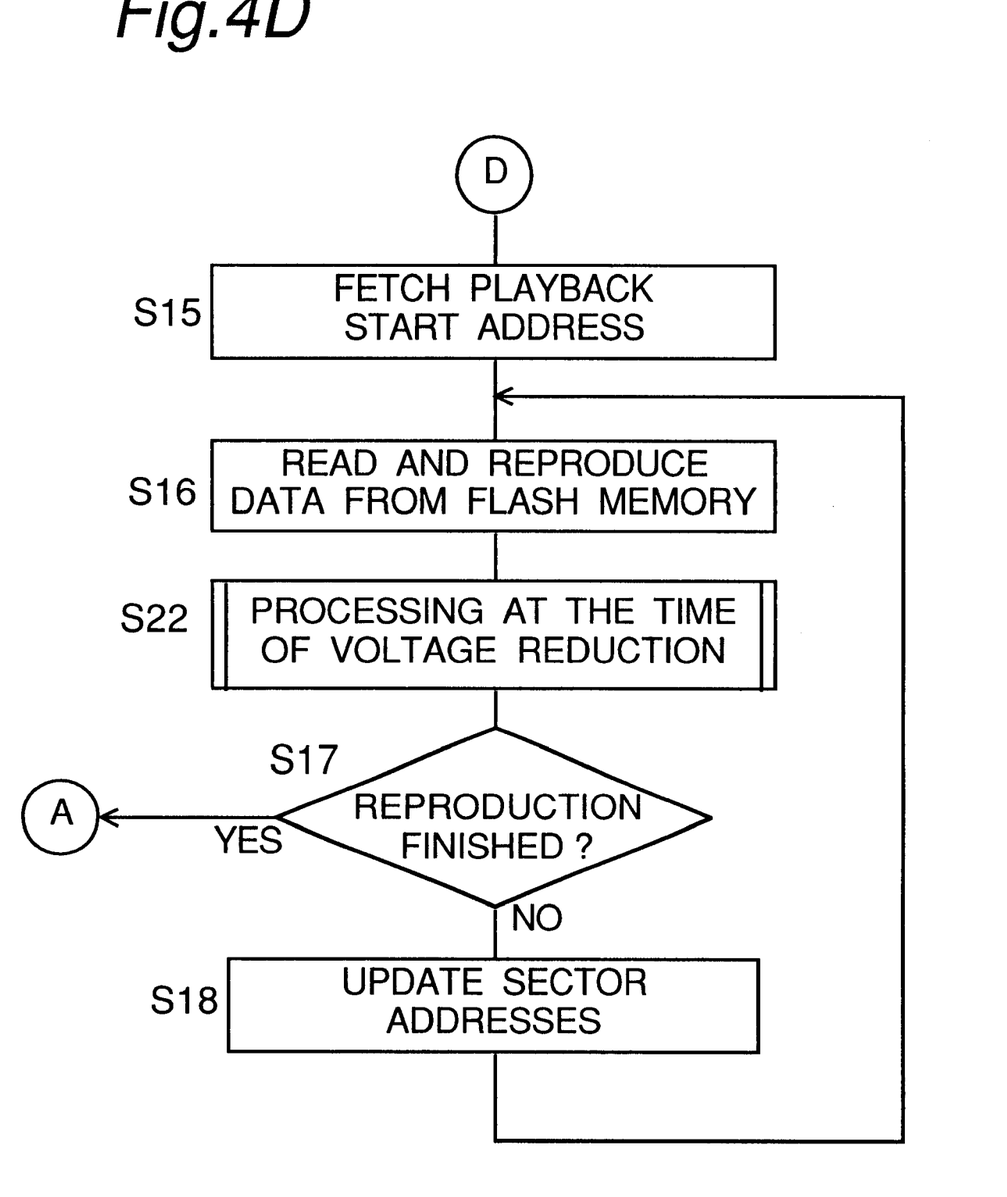
Figure 5:
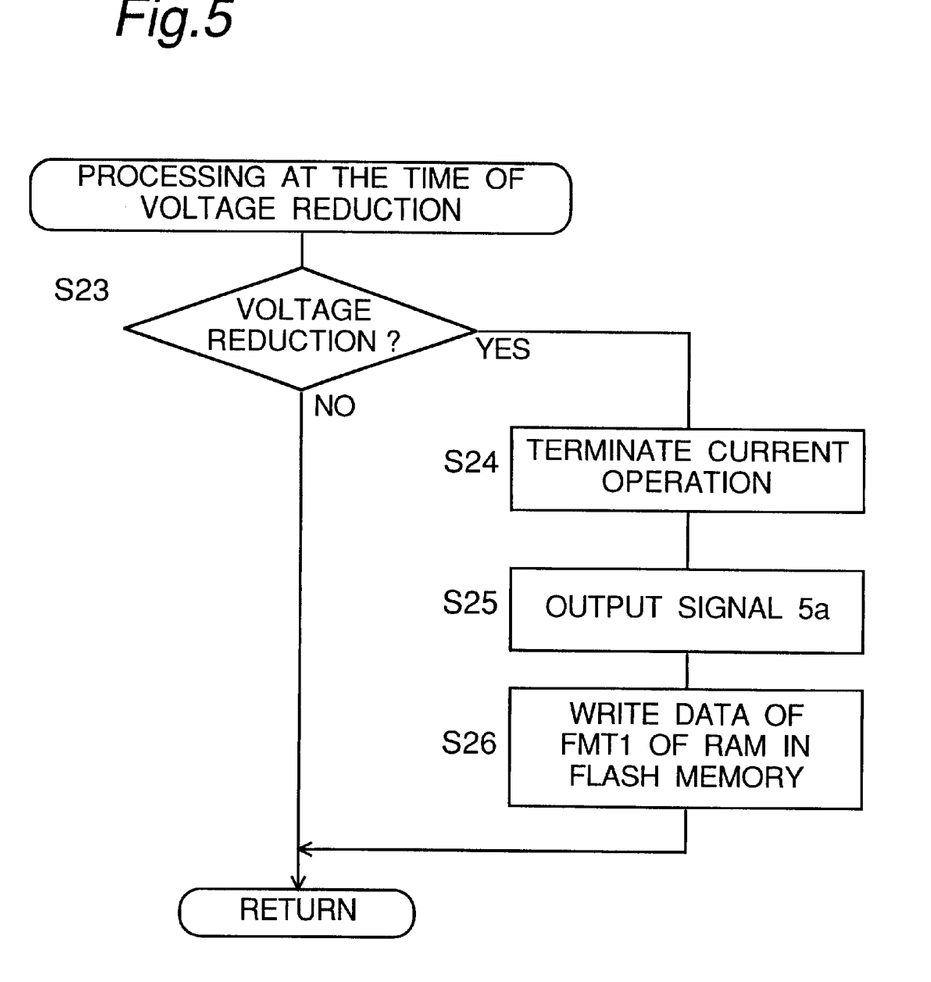
FIG. 5 is a flowchart showing a subroutine in the flowcharts of FIGS. 4A, 4B and 4D.

Thereafter, if it is found at step S2 that the recording key 15a has been inputted, the program flow proceeds to step S3 of FIG. 4B, in which "1" is added to the number of the last file of the file management table FMT1 of the RAM area 51 of the microcomputer 5. Then, at step S4, writing areas are sequentially secured from a leading one of the normal space areas. If the space areas are not available at this time, the writing areas are secured from the linked space areas. Subsequently, at step S5, data obtained from the sound signal processor 8 and link point information are written in a corresponding sector of the flash memory 7. The next step S21 is identical with step S20 of FIG. 4A, in which processings of FIG. 5 are performed. Thus, if voltage reduction has been detected even during recording, latest management information written in the file management table FMT1 of the RAM area 51 of the microcomputer 5 at the time is written in the first file management table FMTI of the file management area 71 of the flash memory 7 such that information in the file management table FMT1 of the microcomputer 5 is equalized with that of the first file management table FMT1 of the flash memory 7. Subsequently, at step S6, it is judged whether or not a request to terminate recording has been made, namely, operation of the stop key 15e or lapse of a recordable period or the like has been detected. In the case of "NO" at step S6, sector addresses are updated at step S7 and then, the program flow returns to step S5 such that recording is continued. On the contrary, in the case of "YES" at step S6, recording operation is terminated and the program flow returns to step S20 of FIG. 4A.

Meanwhile, in the case of "NO" at step S2, it is judged at step S8 whether or not an erasure key of the separate erasure key 15c or the collective erasure key 15d has been inputted. In the case of "YES" at step S8, it is judged at step S9 of FIG. 4C whether or not the files should be erased wholly by the collective erasure key 15d, namely, whether the files should be erased wholly or individually. In the case of "YES" at step S9, the program flow proceeds to step S12 in which start addresses of the normal space areas are set in the file management table FMT1 of the RAM area 51 of the microcomputer 5. Thereafter, "1" is added to start addresses of the current space areas at step S13 and then, the program flow returns to step S20 of FIG. 4A. On the other hand, in the case of "NO" at step S9, the program flow proceeds to step S10 in which link information of the corresponding file to be erased is added to an end of linked space areas of the file management table FMT1 of the RAM area 51 of the microcomputer 5. Subsequently, "1" is subtracted from the number of the last file of the file management table FMT1 of the RAM area 51 of the microcomputer 5 at step S11 so as to update data of the file management table FMT1 of the RAM area 51 of the microcomputer 5 and then, the program flow returns to step S20 of FIG. 4A.

On the other hand, in the case of "NO" at step S8, it is judged at step S14 whether or not the playback key 15b has been inputted. In the case of "YES" at step S14, the program flow proceeds to step S15 of FIG. 4D, in which data on a playback start address is fetched from the corresponding file. Then, at step S16, data is read out of the flash memory 7 and one sector of the data is reproduced by the sound signal processor 8. The next step S22 is identical with step S20 of FIG. 4A, in which processings of FIG. 5 are performed. Thus, if voltage reduction has been detected even during reproduction, latest management information written in the file management table FMT1 of the RAM area 51 of the microcomputer 5 at the time is written in the first file management table FMT1 of the file management area 71 of the flash memory 7 such that information in the file management table FMT1 of the microcomputer 5 is equalized with that of the first file management table FMT1 of the flash memory 7. Thereafter, at step S17, it is judged whether or not a request to terminate reproduction has been made. In the case of "NO" at step S17, sector addresses are updated at step S18 and then, the program flow returns to step S16 such that reproduction is continued. On the other hand, in the case of "YES" at step S17, reproduction is terminated and the program flow returns to step S20 of FIG. 4A. Meanwhile, in the case of "NO" at step S14, the program flow returns to step S20 directly.

Figure 6A:
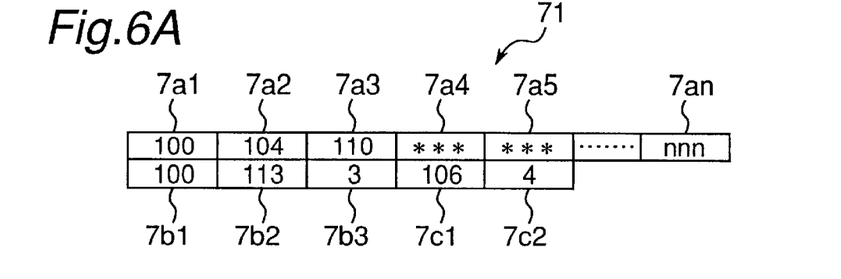
FIGS. 6A and 6B are views showing concrete examples of record tables of a file management area and a data area of the nonvolatile memory of FIG. 2, respectively.
Figure 6B:
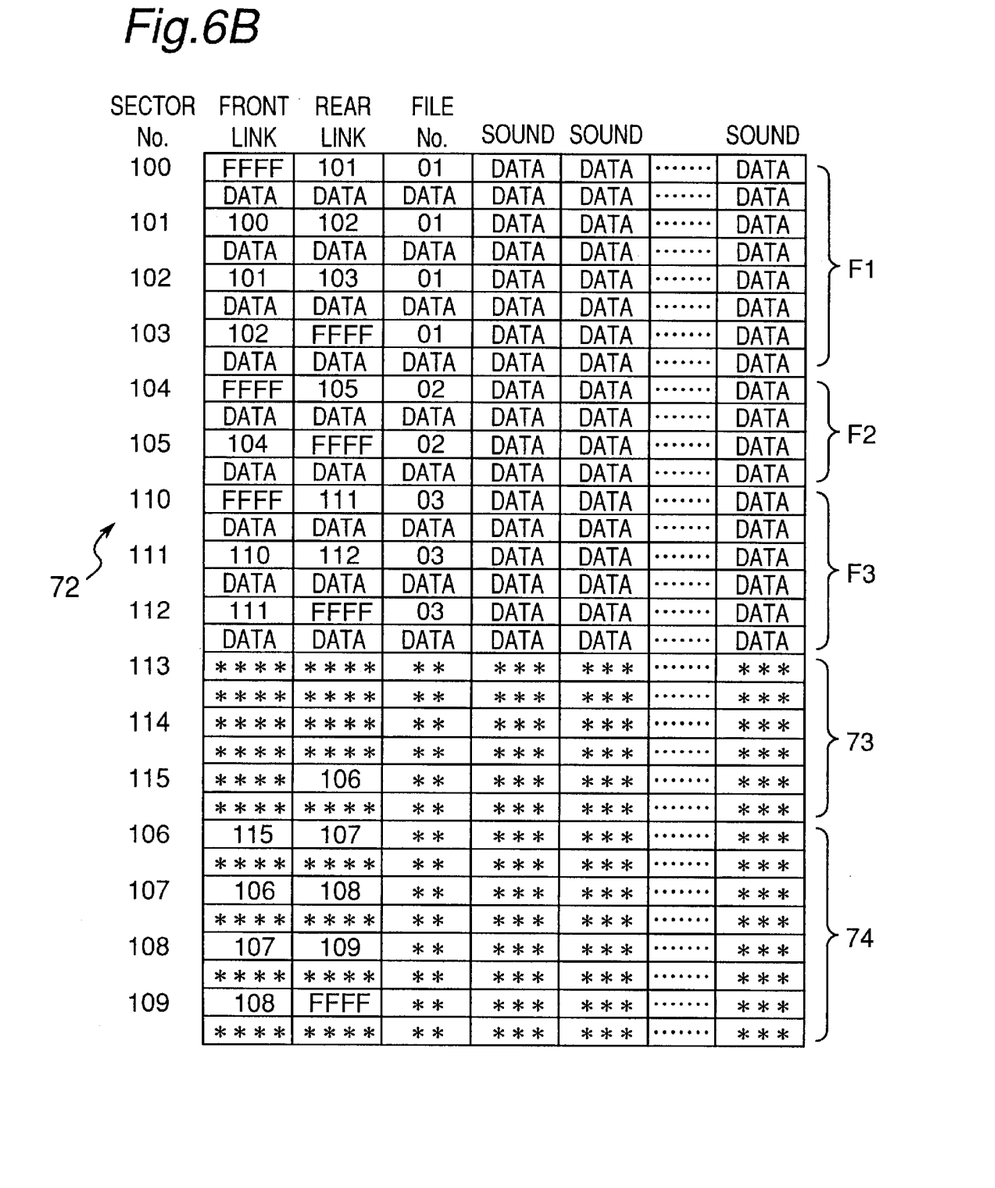

Hereinafter, concrete examples of record tables of the file management area 71 and the data area 72 of the flash memory 7 are described with reference to FIGS. 6A and 6B, respectively. FIGS. 6A and 6B correspond to the working state of the flash memory 7 in which after recording of the four files 1 to 4, the file 3 has been erased separately as shown by the portion (c) of FIG. 3. As shown in FIG. 6B, the data area 72 is constituted by sector Nos. 100 to 115 and recording and reproduction of these 16 sectors are described. Initially, "100" is recorded in the area 7a1 for recording the address of the start sector of the file 1 of the file management area 71. Likewise, "100" is also recorded in the area 7b1 for recording the address of the start address of the space area at the time of start of recording. Since the file 1 (F1) of FIG. 6B uses the sector Nos. 100 to 103, "104"is recorded in the area 7a2 for recording the address of the start sector of the file 2 as shown in FIG. 6A. Meanwhile, the file 2 (F2) uses the sector Nos. 104 to 105. Similarly, since the file 3 (F3) uses the sector Nos. 110 to 112, "110" is recorded in the start sector of the file 3. In FIG. 6B, the normal space area 73 following the file 3 is constituted by three sectors, i.e., the sector Nos. 113 to 115 and is controlled by the area 7b. The sector No. 113 is recorded in the area 7b2 for recording the address of the leading sector of the latest normal space area, while the number "3" of the space sectors is recorded in the area 7b3 for recording the number of the sectors of the latest normal space area.

Meanwhile, the next linked space area 74 is formed by sectors constituting a file which has been separately erased after recording. In this example, the linked space area 74 is formed by four sectors, i.e., the sector Nos. 106 to 109 which were originally placed between the file 2 (F2) and the file 3 (F3). The first sector No. 106 is a first sector of the separately erased file. In this sector No. 106, the address "115" of the last sector of the normal space area 73 is recorded in the area 7d for recording the address of the front link sector and the address "107" is recorded in the area 7e for recording the address of the rear link sector. Meanwhile, in the last sector No. 115 of the normal space area 73, the address "106" of the leading sector of the linked space area 74 is recorded in the area 7e for recording the address of the rear link sector. This means that the sector No. 106 is linked between the sector Nos. 115 and 107. Link information is recorded In the separately erased file as described above. Thus, the sector Nos. 107 to 109 are also linked similarly. As shown in FIG. 6A, the address "106" is recorded in the area 7c1 for recording the address of the start sector of the linked space area 74 and the number "4" from the sector No. 106 to the sector No. 109 is recorded in the area 7c2 for recording the number of sectors of the linked space area 74.

The linked space area 74 which has been separately erased after recording has the sector Nos. identical with those prior to erasure. However, in sequence of recording, the linked space area 74 is linked to the last portion of the normal space area 73 which is secured as the normal space area 73 initially or resecured as the normal space area 73 after collective erasure and exists as an unrecorded area. The sectors which constitute the separately erased file are sequentially linked to one another as the linked space area. Therefore, the linked space area 74 is linked to the last portion of the normal space area 73 for convenience of illustration in FIG. 6B but exists, needless to say, at its original position in the flash memory 7.

Meanwhile, in the sector Nos. 100 to 115 of the data area 72 of Fig. 6B, the link address is not recorded but a file partition, for example, "FFFF" is recorded in the area 7d for recording the address of the front link sector of the first sector of each file, the area 7e for recording the address of the rear link sector of the last sector of each file and the area 7e for recording the address of the rear link sector of the last sector of the linked space area 74. This is because the beginning of each file and the address of the leading sector of the latest space area are controlled by records in the file management area 71.

As is clear from the foregoing description of the present invention, the space area is secured from the beginning of the data area 72 at the time of start of use of the nonvolatile memory and is sequentially used as the data area 72 from the beginning of the data area 72. Thus, without the need for formatting at the time of start of use of the nonvolatile memory, record files of the space area can be sequentially recorded while being linked to one another.

Meanwhile, the area for managing information on the space areas, which is contained in the first file management table FMT1, includes the areas for managing information on the normal space areas and the areas for managing information on the linked space areas so as to manage the normal space areas and the linked space areas separately such that the same space area is not used successively by linking the space areas. Accordingly, since a specific one of the sectors of the nonvolatile memory is not used successively through simple management of the space areas, frequencies of use of the sectors of the nonvolatile memory can be equalized.

Furthermore, since such operations in which the management information is written in the file management table of the nonvolatile memory each time data is recorded on the data area of the nonvolatile memory, i.e., frequent access to the specific portion of the nonvolatile memory can be obviated, service life of the nonvolatile memory can be lengthened. Meanwhile, such marked effects can be gained that latest management information on data recorded on the nonvolatile memory is properly and positively written in the file management table of the nonvolatile memory even at the time of instantaneous interruption or voltage reduction of the power source and that the data recorded on the nonvolatile memory is not invalidated.

What is claimed is:

1. A recording and reproducing apparatus comprising:
   a nonvolatile memory which acts as a recording medium; and
   a control means for executing recording and reproduction on the nonvolatile memory;
   wherein the nonvolatile memory includes a first area for recording management information of whole of the nonvolatile memory and a second area for recording data of respective files;
   wherein the first area has a first file management table produced at the time of start of recording of the files and includes first management area for managing information on addresses of start sectors of the files and a second management area for managing information on usable space areas of the files;
   wherein the second area has a second file management table produced at a leading portion of each of sectors of each of the files on a real-time basis during recording of the files and formed by link information on corresponding ones of the sectors;
   wherein when the control means executes recording and reproduction on the nonvolatile memory, the control means performs file management on the basis of information from the first and second file management tables; and
   wherein at the time of start of use of the nonvolatile memory, the control means secures a space area from a leading portion of the second area so as to use the second area as a data area sequentially from the leading portion of the second area.

2. A recording and reproducing apparatus as claimed in claim 1, wherein the second management area of the first file management table includes a normal area for managing information on a normal space area and a link area for managing information on a linked space area so as to manage the normal space area and the linked space area separately.

3. A recording and reproducing apparatus as claimed in claim 2, wherein when one of the recorded files has been erased separately, sectors constituting the erased file are linked to a rearmost portion of the normal space area secured at the time of start of use of the nonvolatile memory so as to be secured as the linked space area;
   wherein each time a further one of the files is erased separately, the further erased file is added, as a further linked space area, to the linked space area;
   wherein after the normal space area has been completely used for recording the files, the linked space area is sequentially used for recording the files; and
   wherein the number of sectors and the link information of the normal space area and the linked space area, which change each time recording or erasure is performed on the nonvolatile memory, are managed as management information in the normal area and the link area.

4. A recording and reproducing apparatus as claimed in claim 2, wherein when the whole files have been erased collectively, the normal space area is resecured and a start sector for starting use of the normal space area is so set as to be shifted rearwardly by a predetermined number of sectors from that employed at the time of start of use of the nonvolatile memory or at the time of the previous collective erasure of the whole files; and
   wherein the start sector is managed as management information in the normal area.

5. A recording and reproducing apparatus as claimed in claim 4, further comprising:
   a storage means for storing the start sector such that the start sector is further shifted rearwardly by the predetermined number of sectors on the basis of storage of the storage means each time the whole files are erased collectively.

6. A recording and reproducing apparatus as claimed in claim 2, wherein the normal area includes first, second and third normal area segments for storing an address of a start sector of the normal space area at the time of start of recording, an address of a start sector of the latest normal space area and the number of sectors of the latest normal space area, respectively;
   wherein the link area is formed by information on sectors constituting a separately erased one of the files and includes first and second link area segments for recording an address of a start sector of the linked space area linked to a last sector of the normal space area and the number of sectors of the linked space area, respectively, which sectors are subsequently separately erased and sequentially linked to one another; and
   wherein the control means executes recording on the nonvolatile memory on the basis of space area information managed in the normal area and the link area.

7. A recording and reproducing apparatus as claimed in claim 3, wherein the normal area includes first, second and third normal area segments for storing an address of a start sector of the normal space area at the time of start of recording, an address of a start sector of the latest normal space area and the number of sectors of the latest normal space area, respectively;
   wherein the link area is formed by information on sectors constituting a separately erased one of the files and includes first and second link area segments for recording an address of a start sector of the linked space area linked to a last sector of the normal space area and the number of sectors of the linked space area, respectively, which sectors are subsequently separately erased and sequentially linked to one another; and wherein the control means executes recording on the nonvolatile memory on the basis of space area information managed in the normal area and the link area.

8. A recording and reproducing apparatus as claimed in claim 4, wherein the normal area includes first, second and third normal area segments for storing an address of a start sector of the normal space area at the time of start of recording, an address of a start sector of the latest normal space area and the number of sectors of the latest normal space area, respectively;

wherein the link area is formed by information on sectors constituting a separately erased one of the files and includes first and second link area segments for recording an address of a start sector of the linked space area linked to a last sector of the normal space area and the number of sectors of the linked space area, respectively, which sectors are subsequently separately erased and sequentially linked to one another; and wherein the control means executes recording on the nonvolatile memory on the basis of space area information managed in the normal area and the link area.

9. A recording and reproducing apparatus as claimed in claim 5, wherein the normal area includes first, second and third normal area segments for storing an address of a start sector of the normal space area at the time of start of recording, an address of a start sector of the latest normal space area and the number of sectors of the latest normal space area, respectively;

wherein the link area is formed by information on sectors constituting a separately erased one of the files and includes first and second link area segments for recording an address of a start sector of the linked space area linked to a last sector of the normal space area and the number of sectors of the linked space area, respectively, which sectors are subsequently separately erased and sequentially linked to one another; and wherein the control means executes recording on the nonvolatile memory on the basis of space area information managed in the normal area and the link area.

10. A recording and reproducing apparatus as claimed in claim 1, wherein the control means is formed by a microcomputer having a RAM area;

wherein during normal operation of recording of the data in the second area of the nonvolatile memory, the management information to be recorded in the first area of the nonvolatile memory is written in the RAM area of the microcomputer without being written in the first area; and wherein when a voltage of a power source of the recording and reproducing apparatus has dropped below a predetermined level, the management information is written in the first area of the nonvolatile memory from the RAM area of the microcomputer.

11. A recording and reproducing apparatus as claimed in claim 1, wherein the control means is formed by a microcomputer having a RAM area, the recording and reproducing apparatus further comprising:

a main power source;

an auxiliary power source which is recharged by an output of the main power source;

a power source switching means for switching over a power source of the microcomputer to an output of the auxiliary power source from the output of the main power source; and a signal processor which performs analog and digital signal transformation so as to record digital data on the nonvolatile memory;

wherein during normal operation of recording and reproduction of the data in the second area of the nonvolatile memory, the management information to be recorded in the first area of the nonvolatile memory is written in the RAM area of the microcomputer without being written in the first area; and wherein when a voltage of the main power source has dropped below a predetermined level, the power source switching means switches over the power source of the microcomputer to the output of the auxiliary power source from the output of the main power source by a command of the microcomputer and the management information recorded in the RAM area of the microcomputer is written in the first area of the nonvolatile memory from the RAM area of the microcomputer.

\* \* \* \* \*